(12) United States Patent
Lee et al.

(10) Patent No.: US 11,508,814 B2
(45) Date of Patent: Nov. 22, 2022

(54) TRANSISTOR INCLUDING TWO-DIMENSIONAL (2D) CHANNEL

(71) Applicant: Samsung Electronics Co., Ltd., Suwon-si (KR)

(72) Inventors: Minhyun Lee, Suwon-si (KR); Minsu Seol, Seoul (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/111,965

(22) Filed: Dec. 4, 2020

(65) Prior Publication Data

US 2021/0226010 A1 Jul. 22, 2021

(30) Foreign Application Priority Data

Jan. 21, 2020 (KR) .......................... 10-2020-0007969

(51) Int. Cl.
*H01L 29/10* (2006.01)
*H01L 29/36* (2006.01)
*H01L 29/423* (2006.01)

(52) U.S. Cl.
CPC .......... *H01L 29/1033* (2013.01); *H01L 29/36* (2013.01); *H01L 29/4232* (2013.01)

(58) Field of Classification Search
CPC . H01L 29/1033; H01L 29/36; H01L 29/4232; H01L 29/1045; H01L 29/1083;
(Continued)

(56) References Cited

U.S. PATENT DOCUMENTS

2009/0090984 A1* 4/2009 Khan ................ H01L 29/66462
257/E21.24
2014/0097537 A1 4/2014 Park et al.
(Continued)

FOREIGN PATENT DOCUMENTS

EP 2720273 A1 4/2014
EP 3467877 A1 4/2019
(Continued)

OTHER PUBLICATIONS

Extended European Search Report dated Jun. 8, 2021 in European Application No. 20217769.7.
(Continued)

*Primary Examiner* — Shahed Ahmed
(74) *Attorney, Agent, or Firm* — Harness, Dickey & Pierce, P.L.C.

(57) ABSTRACT

A transistor including at least one two-dimensional (2D) channel is disclosed. A transistor according to some example embodiments includes first to third electrodes separated from each other, and a channel layer that is in contact with the first and second electrodes, parallel to the third electrode, and includes at least one 2D channel. The at least one 2D channel includes at least two regions having different doping concentrations. A transistor according to some example embodiments includes: first to third electrodes separated from each other; a 2D channel layer that is in contact with the first and second electrodes and parallel to the third electrode; a first doping layer disposed under the 2D channel layer corresponding to the first electrode; and a second doping layer disposed under the 2D channel layer corresponding to the second electrode, wherein the first and second doping layers contact the 2D channel layer.

42 Claims, 11 Drawing Sheets

(58) Field of Classification Search
CPC ............... H01L 29/7391; H01L 29/778; H01L 29/7781; H01L 29/78681; H01L 29/24; H01L 29/0684; H01L 29/1054; H01L 29/78; H01L 29/0665; H01L 29/06; H01L 29/0847; H01L 27/156; H01L 29/7373

See application file for complete search history.

(56) References Cited

U.S. PATENT DOCUMENTS

| | | | |
|---|---|---|---|
| 2016/0056301 A1* | 2/2016 | Lee | H01L 29/42352 257/295 |
| 2016/0190244 A1 | 6/2016 | Lee et al. | |
| 2018/0012536 A1* | 1/2018 | Shishido | H01L 27/323 |
| 2018/0090317 A1 | 3/2018 | Lee et al. | |
| 2018/0114839 A1* | 4/2018 | Wu | H01L 29/778 |
| 2018/0151700 A1 | 5/2018 | Lin et al. | |
| 2018/0182849 A1 | 6/2018 | Alian et al. | |
| 2018/0190800 A1 | 7/2018 | Byun et al. | |
| 2018/0226248 A1 | 8/2018 | Jahangir et al. | |
| 2018/0240887 A1 | 8/2018 | Koenig et al. | |
| 2019/0019882 A1 | 1/2019 | Lin et al. | |
| 2019/0067375 A1 | 2/2019 | Karda et al. | |
| 2019/0164754 A1 | 5/2019 | Kim et al. | |

FOREIGN PATENT DOCUMENTS

| | | |
|---|---|---|
| KR | 10-2017-0045040 A | 4/2017 |
| KR | 10-2017-0130646 A | 11/2017 |
| KR | 10-2019-0005080 A | 1/2019 |
| WO | WO-2016/200971 A1 | 12/2016 |
| WO | WO-2018/026830 A1 | 2/2018 |

OTHER PUBLICATIONS

M. Chhowalla et al., "Two-dimensional semiconductors for transistors", Nature Review, Materials (2016).

F. Schwierz et al., "Two-dimensional materials and their prospects in transistor electronics", Nanoscale, Apr. 3, 2015.

Y. Liu et al., , "Van der Waals heterostructures and devices",Nature Review, Materials, vol. Sep. 1, 2016.

X. Song et al., "A Novel Synthesis Method for Large-Area MOS2 Film With Improved Electrical Contact", 2D Materials, Mar. 17, 2017.

W. Liu et al., "Role of Metal Contacts in Designing High-Performance Monolayer N.Type WSE2 Field Effect Transistors", Nano Letters, Mar. 25, 2013.

C. D. English et al., , "Improved Contacts to MoS2 Transistors by Ultra-High Vacuum Metal Deposition",Nano Letters, (2016).

S. Xie et al., , "Coherent, atomically thin transition-metal dichalcogenide superlattices with engineered strain",Science (2018).

J. Gao et al., , "Transition-Metal Substitution Doping in Synthetic Atomically Thin Semiconductors", Adv. Mater. (2016).

* cited by examiner

TRANSISTOR INCLUDING TWO-DIMENSIONAL (2D) CHANNEL

CROSS-REFERENCE TO RELATED APPLICATION

This application claims the benefit of Korean Patent Application No. 10-2020-0007969, filed on Jan. 21, 2020, in the Korean Intellectual Property Office, the disclosure of which is incorporated herein in its entirety by reference.

BACKGROUND

1. Field

The present disclosure relates to transistors, and more particularly, to transistors including channels including a two-dimensional (2D) material.

2. Description of Related Art

As the degree of integration of semiconductor apparatuses increases, both the contact resistance between members or layers comprising a semiconductor device (for example, a transistor) and the contact resistance between semiconductor devices included in a semiconductor apparatus may have a greater effect on the operation of the semiconductor device and the operational characteristics of a semiconductor apparatus.

Various attempts have been made to improve the operational characteristics of transistors. Accordingly, in recent years, transistors including a channel comprising a two-dimensional (2D) material have been introduced. Since the 2D material has higher mobility than a 3D material, the operating speed of a transistor including the 2D material as a channel may be increased.

SUMMARY

Provided are transistors including a doped 2D channel.

Additional aspects will be set forth in part in the description which follows and, in part, will be apparent from the description, or may be learned by practice of the presented embodiments of the disclosure.

According to an aspect of some example embodiments, a transistor includes a first electrode; a second electrode separated from the first electrode; a gate electrode between the first and second electrodes; and a channel layer including a two-dimensional (2D) channel and comprising at least two regions having different doping concentrations, the channel layer contacting the first electrode and the second electrode.

In one example, the channel layer may be entirely a 2D channel. The channel layer may include a first region, a second region, and a third regions having different doping concentrations compared to a neighboring region. The doping concentrations of two regions of the first to third regions may be the same, and different from the doping concentrations of the remaining region between the two regions. The first to third regions may be doped with the same type of dopant.

According to some example embodiments, the first to third regions may be doped with N+ type dopant, N type dopant, and N+ type dopant, respectively or may be doped with P+ type dopant, P type dopant, and P+ type dopant, respectively.

According to some example embodiments, the two regions may be doped with a first type of dopant, and the remaining region may be doped with a second type of dopant different from the first type of dopant. The first type dopant may include an N+ type dopant or P+ type dopant. The second type dopant may include an N type dopant or P type dopant.

According to some example embodiments, the two regions may be regions doped with different types of dopants, and the remaining region may be doped with the same type of dopants as one of the two regions. The two regions may be N+ type and P+ type regions or P+ type and N+ type regions. The remaining region may be a P type or N type region.

The channel layer may include a first 2D channel and a second 2D channel including different materials from each other. The material of the first 2D channel may include a transition metal dichalcogenide (TMD) or black phosphorous (BP). The material of the second 2D channel may include a TMD or BP. The first 2D channel and the second 2D channel may each include two regions having different doping concentrations from each other. In regions corresponding to the gate electrode, regions where the doping concentrations of the first and second 2D channels are low may be in contact with each other and overlap each other. The transistor may be a tunneling transistor. Doped types of the overlapping regions of the first and second 2D channels may be different from each other.

According to some example embodiments, the channel layer may include a 2D channel and a 3D channel. In regions corresponding to the third electrode, the 2D channel and a portion of the 3D channel may overlap each other. The 3D channel may be in contact with the first electrode, and the 2D channel may be in contact with the second electrode. A doping layer may be provided under the 2D channel corresponding to the second electrode. The 2D channel may include two regions with different doping concentrations from each other. The 3D channel may include two regions with different doping concentrations from each other.

The material of the 2D channel may include a TMD or BP. In an example, the 2D channel may include a TMD and at least one heterogeneous element other than the material constituting the TMD as a doping material.

The transistor may be a top gate or bottom gate transistor.

According to some example embodiments, a transistor may include: source, drain, and gate electrodes separated from each other; a 2D channel layer in contact with the source and drain electrodes; a first doping layer under the 2D channel layer corresponding to the source electrode; and a second doping layer under the 2D channel layer corresponding to the drain electrode, wherein the first and second doping layers contact the 2D channel layer.

In an example, a portion of the 2D channel layer corresponding to the gate electrode may have a first doping concentration. Portions of the 2D channel layer contacting the first and second doping layers may have a second doping concentration greater than the first doping concentration.

A portion of the second channel layer corresponding to the gate electrode may be doped with a first type of dopant, and portions of the 2D channel layer contacting the first and second doping layers may be doped with a second type of dopant supplied from the first and second doping layers. The first type dopant may include an N type dopant or a P type dopant. The second type dopant may include an N type dopant or a P type dopant. The third electrode may be provided above or below the channel layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
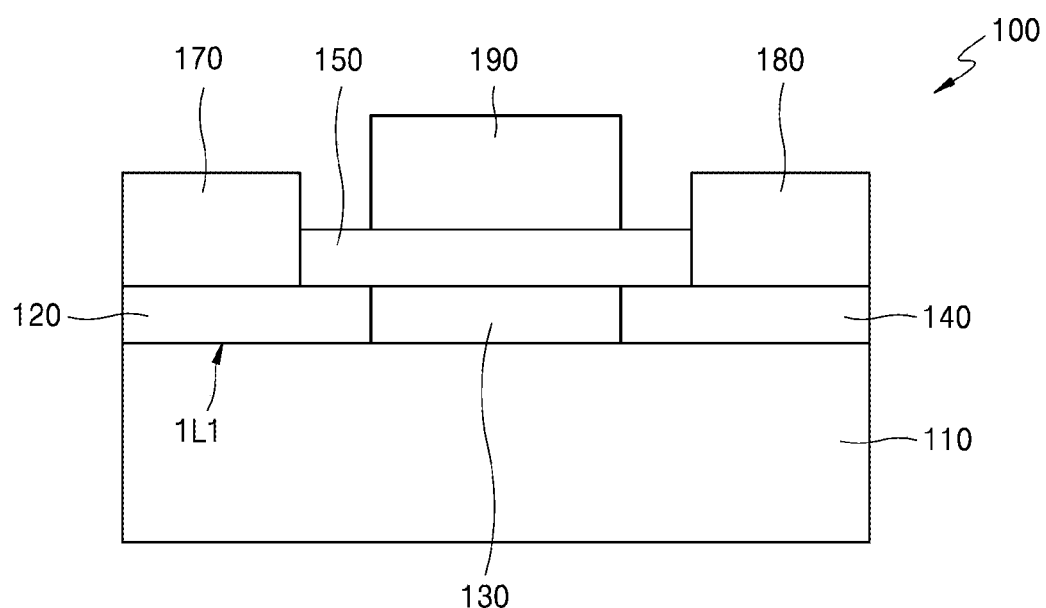
FIG. 1 is a cross-sectional view of a transistor including a two-dimensional (2D) channel according to some example embodiments.

Reference will now be made in detail to example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "below," "under," "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a transistor including a two-dimensional (2D) channel according to some example embodiments will be described in detail with reference to the accompanying drawings. In this process, the thicknesses of the layers or regions in the drawings may be exaggerated for clarity. Also, the following embodiments described below are merely illustrative, and various modifications may be possible from the embodiments of the present disclosure. In a layer structure described below, when a position of an element is described using an expression "above" or "on", the layer may be directly on another layer or intervening layers.

FIG. 1 shows a transistor 100 including a two-dimensional (2D) channel according to some example embodiments.

Referring to FIG. 1, the transistor 100 includes a substrate 110 and a 2D channel layer 1L1, first to third electrodes 170, 180, and 190, and an insulating layer 150 that are on the substrate 110. The substrate 110 may be an insulating substrate. The 2D channel layer 1L1 may include first to third regions 120, 130, and 140. The first electrode 170 may be on the first region 120. The first electrode 170 may be in direct contact with the first region 120. The first electrode 170 may cover at least a portion of an upper surface of the first region 120. The first electrode 170 may be a source electrode.

The second electrode 180 may be on the third region 140. The second electrode 180 may be in direct contact with the third region 140. The second electrode 180 may cover at least a portion of an upper surface of the third region 140. On an upper surface of the 2D channel layer 1L1, the second electrode 180 is separated from the first electrode 170. The second electrode 180 may be a drain electrode. The first and second electrodes 170 and 180 may have an equal thickness or different thicknesses from each other. The first and second electrodes 170 and 180 may be a layer and/or layers formed of a conductive material through which a current required for normal operation of the transistor 100 may flow. For example the electrodes 170 and 180 may include metals, doped semiconductors, and/or conductive carbon-based materials like graphene and/or conductive polymers. The first and second electrodes 170 and 180 may comprise the same or different materials from each other. In some example embodiments, the first and second electrodes 170 and 180 may be formed at the same time. In another example embodiment, the formation order of the first and second electrodes 170 and 180 may be different. For example, one of the first and second electrodes 170 and 180 may be formed before the other.

The insulating layer 150 may be between the first and second electrodes 170 and 180. The insulating layer 150 may contact the first and second electrodes 170 and 180. For example, one end of the insulating layer 150 may contact the first electrode 170 and the other end may contact the second electrode 180, respectively. However, the present disclosure is not limited thereto.

The insulating layer 150 may be above the second region 130 of the 2D channel layer 1L1. The insulating layer 150 may cover an upper surface, for example, an entire upper surface of the second region 130. The insulating layer 150 may also cover a portion of the upper surface of the first region 120 exposed between the first and third electrodes 170 and 190. The insulating layer 150 may also cover a portion of the upper surface of the third region 140 exposed between the second and third electrodes 180 and 190. For example, the insulating layer 150 may be cover the entire upper surface of the second region 130 of the 2D channel layer 1L1 and portions of the upper surfaces of the first and third regions 120 and 140 adjacent to the second region 130. The insulating layer 150 may be used as a gate insulating layer. The insulating layer 150 may be a dielectric layer. For example, the insulating layer 150 may include an oxide layer and/or a nitride layer. The third electrode 190 may be formed on the insulating layer 150. The third electrode 190 may contact an upper surface of the insulating layer 150. The third electrode 190 may be between and is separated from the first and second electrodes 170 and 180. A distance between the third electrode 190 and the first electrode 170 and a distance between the third electrode 190 and the second electrode 180 may be the same to each other. In another example embodiment, the distance between the third electrode 190 and the first electrode 170 and the distance between the third electrode 190 and the second electrode 180 may be different from each other. The third electrode 190 may be used as a gate electrode. Any material that may be used as a gate electrode of a field effect transistor or a tunneling transistor may be used as a material for forming the third electrode 190.

The third electrode 190 may have a thickness the same as or different from that of the first and second electrodes 170 and 180. For example, when the thicknesses of the first and second electrodes 170 and 180 are different from each other, the thickness of the third electrode 190 may be the same as the thickness of any one of the first and second electrodes 170 and 180 or may be different from both the first and second electrodes 170 and 180. The third electrode 190 may be formed earlier or later than the first and second electrodes 170 and 180. The third electrode 190 may be at a position corresponding to the second region 130 of the 2D channel layer 1L1. For example, the third electrode 190 may be above the second region 130 and facing the second region 130 with the insulating layer 150 therebetween. A width of the third electrode 190 may be at least the same as a width of the second region 130 in a direction parallel to an upper surface of the substrate 110. For example, the width of the third electrode between the first and second electrodes may be the same as the corresponding width of the second region 130. In another example embodiment, the width of the third electrode 190 may be different from the width of the second region 130, for example, the width of the third electrode 190 may be greater than the width of the second region 130.

Figure 10:
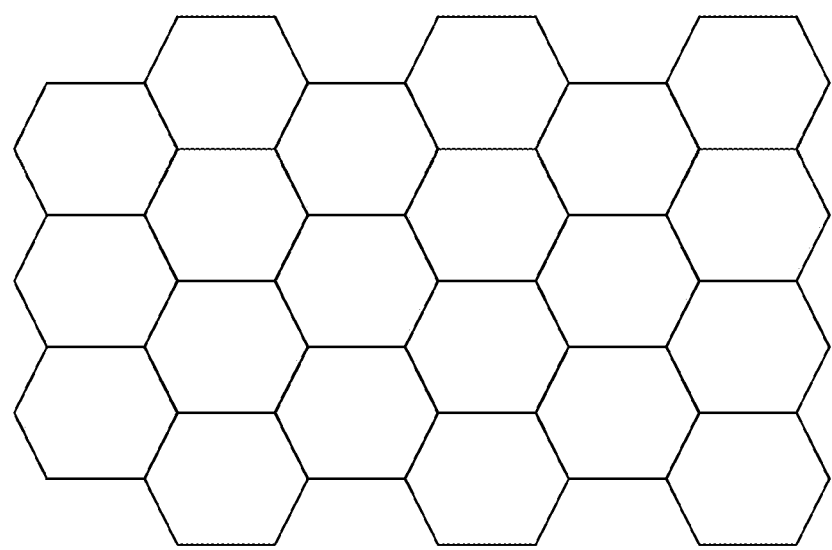
FIG. 10 is an illustration of an example 2D lattice.
Figure 10:
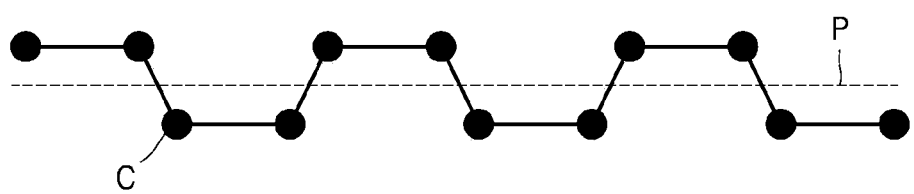

FIG. 10 is an illustration of an example 2D lattice.

Referring to FIG. 10, a 2D material may be a crystalline structure of various elements and/or compounds C, arranged in a 2D lattice. The example 2D lattice is illustrated, for simplicity, as a hexagonal (e.g., honeycomb) structure, with an arm-chair configuration in the planar orientation; however, the present disclosure is not limited thereto. Though the atoms and/or compounds C comprising the 2D material may exist above and/or below a layer P, the 2D lattice may comprise vertices ordered in parallel with the layer P. A 2D material is in contrast to a 3-dimensional (3D) material (not illustrated), which may comprise a structure in three dimensions. For example, in the case of a crystalline and/or polycrystalline 3D material, a 3D material would include a 3D lattice structure comprising elements and/or compounds bonded with covalent, ionic, and/or metallic bounds; the elements and/or compounds defining vertices in the 3D lattice. In another example, a 3D amorphous material may include a network of bonded elements and/or components extending in three dimensions.

Referring back to FIG. 1, in some example embodiments, the 2D channel layer 1L1 may be a single layer (e.g., a monolayer) of a 2D material. In another example embodiment, the 2D channel layer 1L1 may include a plurality of layers of the 2D material. For example, the 2D channel layer 1L1 may include a layer structure in which two to five layers of 2D material layers are stacked. In the case of a layer structure, the layers of the 2D material may be bonded by van der Waal forces, and may comprise, for example, a van der Waals heterostructure and/or homostructure. The orientation of the 2D material comprising the 2D channel layer 1L1 may correlate with the plane of the substrate 110 and/or the plane of the third electrode 190. For example, the 2D material may lay substantially flat on the substrate 110 and/or extend in parallel with a surface of the third electrode 190 in contact with the insulating layer 150. The first to third regions 120, 130, and 140 of the 2D channel layer 1L1 may be laterally formed side by side on the upper surface of the substrate 110. The first to third regions 120, 130, and 140 of the 2D channel layer 1L1 are consecutive regions in the 2D channel layer 1L1 and may differ in their dopant types and their doping concentration. Though illustrated, for simplicity, as a well-defined boundary, the interface between the first to third regions 120, 130, and 140 of the 2D channel layer 1L1 may include a gradient region, for example, wherein the doping concentration at the interface forms a gradient between the regions. The entire 2D channel layer 1L1 may be a 2D material layer formed of the same 2D material. For example, the first to third regions 120, 130, and 140 may be consecutive 2D material layers. The first and third regions 120 and 140 may be regions epitaxially grown in a lateral direction from the second region 130. For example, the second region 130 may act as a nucleation center for the first and third regions 120 and 140, such that the first and third regions 120 and 140 are grown from the edges of the second region 130. The epitaxial growth of the first and third regions 120 and 140 may promote the formation of a 2D lattice structure in a layer and/or layers of the first and third regions 120 and 140 parallel to the surface on which the layer and/or layers are grown. The growth of the second region 130 may be performed on the substrate 110 or on other substrate. When the growth of the second region 130 is performed on another substrate (not shown), the 2D channel layer 1L1 may be formed on the other substrate and transferred onto the substrate 110. The 2D channel layer 1L1 may be a transition metal dichalcogenide (TMD) layer and/or may include a TMD layer. The TMD layer may be a 2D material layer including a transition metal, for example, at least one of Mo, W, Ti, Ni, Ta, Hf, and Zr, and a dichalcogenide, for example, at least one of S, Se, and Te. In another example, the 2D channel layer 1L1 may be a black phosphorous (BP) layer and/or may include a BP layer. The 2D channel layer 1L1 may also include phosphorene. The different doping concentrations and dopant types of the first to third regions 120, 130, and 140 may be obtained by controlling the concentrations of the doping materials during a doping process in each region and selectively using a P-type dopant or an N-type dopant in the process of forming the first to third regions 120, 130, 140 of the 2D channel layer 1L1.

Doping of the first to third regions 120, 130, and 140 may be performed by using a substitutional doping method and/or a chemical surface doping method. The substitution doping method is, for example, a doping method substituting an element of a 2D material of the first to third regions 120, 130, and 140 with a doping material. When the 2D channel layer 1L1 is formed with a TMD layer, a dopant containing at least one heterogeneous element other than a material constituting the TMD layer may be used. For example, the dopant may include at least one metal element, such as V, Nb, Ta, Cr, Mn, Tc, Re, Fe, Ru, Co, Ni, etc. or may include at least one of nonmetallic elements, such as O, N, P, As, Sb, F, Cl, Br, I, etc.

When the 2D channel layer 1L1 is formed with a BP layer, a dopant including at least one of B, C, N, O, F, Al, Si, S, Cl, G, Ge, Se, and Br may be used.

The chemical surface doping method may be, for example, a doping method commonly performed in a semiconductor manufacturing process. In the chemical surface doping method, for example, benzyl viologen (BV) may be used as an N-type dopant, and/or $AuCl_3$ may be used as a P-type dopant.

Doping concentrations of two regions among the first to third regions 120, 130, and 140 may be different from each other. For example, the first to third regions 120, 130 and 140 may have different doping concentrations when compared to the neighboring region, such that the first and third regions 120 and 140 may be formed to have a first doping concentration, and the remaining second region 130 may be formed to have a second doping concentration. The first doping concentration may be greater than the second doping concentration. Accordingly, the doping concentration of the second region 130 may be lower than the doping concentrations of the first and third regions 120 and 140; and the doping concentration of a channel under the third electrode 190 may be lower than the doping concentration of channels under the first and second electrodes 170 and 180. In one example, the first doping concentration may be $1e13/cm^2$ or more, for example, in a range from about $1e13/cm^2$ to about $1e16/cm^2$. The second doping concentration may be $1e13/cm^2$ or less, for example, in a range from about $1e8/cm^2$ to about $1e13/cm^2$.

The first to third regions 120, 130, and 140 may have a doping concentration distribution as described above and/or may also have different dopant types.

Example Embodiment 1

The first to third regions 120, 130, and 140 may be entirely doped with the same conductive type dopant. For example, the first to third regions 120, 130, and 140 may include the same type of dopant (e.g., a P or N type dopant). For example, the first to third regions 120, 130, and 140 respectively may be doped with an N+ type dopant, an N type dopant, and an N+ type dopant, wherein "+" represents a higher relative concentration of the associated dopant. Accordingly, the first to third regions 120, 130, and 140 respectively may include an N+ type dopant, an N type dopant, and an N+ type dopant materials. Accordingly, when the transistor 100 follows the Example Embodiment 1, the transistor 100 may operate in a depletion mode.

Hereinafter, the case wherein the first to third regions 120, 130, and 140 respectively are doped with an N+ type dopant, an N type dopant, and an N+ type dopant, for simplicity, will be referred to as, for example, first to third regions 120, 130, and 140 doped with N+/N/N+. In the case of doping with another type of dopant (e.g. a P type dopant), the same expression will be used (e.g., P+/P/P+). However, the "+" does not indicate that the associated regions share the same concentration of dopants. For example, the N+ regions (e.g., regions 120 and 140 in Example Embodiment 1) may or may not have the same concentration of dopants.

Example Embodiment 2

The first to third regions 120, 130, and 140 respectively may be doped with P+/P/P+. Accordingly, when the transistor 100 follows the Example Embodiment 2, the transistor 100 may be operated in an enhancement mode.

Hereinafter, Example Embodiments 3 to 8 will describe a case when the dopant type of two regions among the first to third regions 120, 130, and 140 is different from the dopant type of the other region.

Example Embodiment 3

The first to third regions 120, 130, and 140 respectively may be doped with N+/P/N+.

Example Embodiment 4

The first to third regions 120, 130, and 140 respectively may be doped with P+/N/P+.

Example Embodiment 5

The first to third regions 120, 130, and 140 respectively may be doped with N+/P/P+.

Example Embodiment 6

The first to third regions 120, 130, and 140 respectively may be doped with N+/N/P+.

Example Embodiment 7

The first to third regions 120, 130, and 140 respectively may be doped with P+/P/N+.

Example Embodiment 8

The first to third regions 120, 130, and 140 respectively may be doped with P+/N/N+.

As described above, the 2D channel layer 1L1 may have different doping concentrations according to regions. In the 2D channel layer 1L1, the doping concentration of a region in contact with the first and second electrodes 170 and 180 may be greater than the doping concentration in other regions of the 2D channel layer 1L1. Therefore, a contact resistance between the first and second electrodes 170 and 180 and the 2D channel layer 1L1 may be less than that of a 2D channel transistor of the related art. As a result, the operation speed of the transistor 100 may be increased, and power consumption may be reduced. These characteristic may equally appear in the example embodiments described below.

Figure 2:
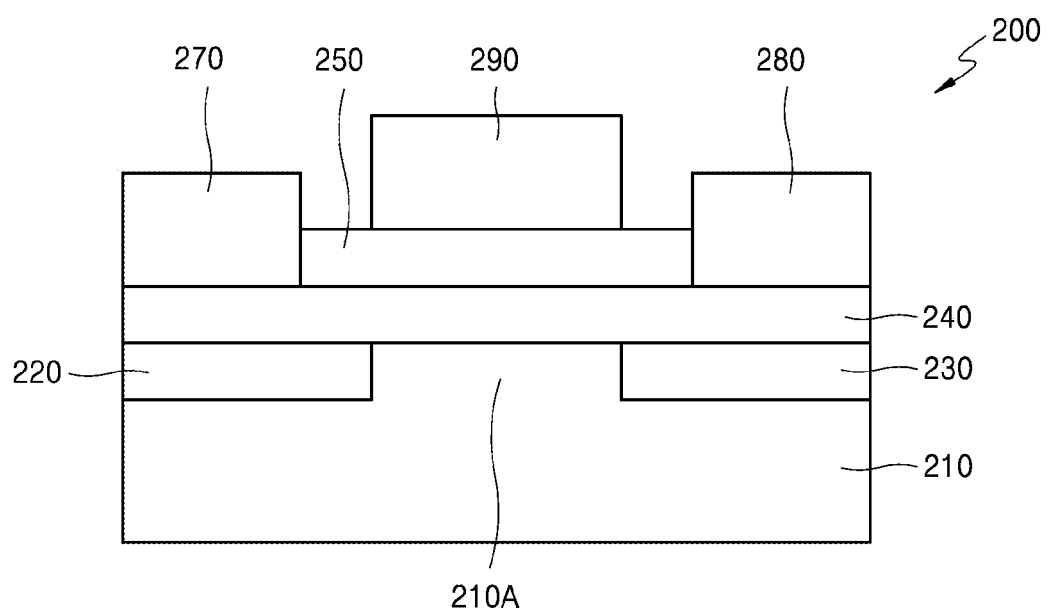
FIG. 2 is a cross-sectional view of a transistor including a 2D channel according to some example embodiments.

FIG. 2 shows a transistor 200 including a 2D channel according to some example embodiments.

Referring to FIG. 2, the transistor 200 includes a substrate 210 and a 2D channel layer 240, first to third electrodes 270, 280, and 290, and an insulating layer 250 that are on the substrate 210. The substrate 210 may include, for example, the same material as the substrate 110 of FIG. 1. The 2D channel layer 240 may be in material the same as the 2D channel layer 1L1 of FIG. 1. The entire 2D channel layer 240 may have a doping concentration corresponding to the second region 130 of the 2D channel layer 1L1 of FIG. 1.

The 2D channel layer 240 may include a P-type dopant or an N-type dopant material. The role, material, and arrangement of the first electrode 270, the second electrode 280, and the third electrode 290 may follow those of the first electrode 170, the second electrode 180, and the third electrode 190 of FIG. 1, respectively. The role, material, and arrangement relationship between a material and an adjacent member of the insulating layer 250 may follow those of the insulating layer 150 of FIG. 1.

First and second doping layers 220 and 230 may be under the 2D channel layer 240. The first and second doping layers 220 and 230 may be separate from each other by a protruding portion 210A of the substrate. The first doping layer 220 may be located below the first electrode 270 and the second doping layer 230 may be located below the second electrode 280. The doping concentrations of the first and second doping layers 220 and 230 may be greater than a region of the 2D channel layer 240. For example, the doping concentrations of the first and second doping layers 220 and 230 may be greater than the doping concentration in a region of the 2D channel layer 240 between the third electrode 290 and the protruding portion 210A of the substrate 210.

The first and second doping layers 220 and 230 may be a layer formed by doping a conductive dopant into corresponding regions of the substrate 210. The substrate 210 may include, for example, the same material as the substrate 110 of FIG. 1, but may include different materials. For example, the substrate may be a bulk (e.g., 3D) semiconductor material like Si and/or Ge. The first doping layer 220 may be a layer for increasing the doping concentration of the 2D channel layer 240 under the first electrode 270, for example through contact doping between the 2D channel layer 240 and the first doping layer 220. As the ratio between the surface and the cross-sectional area of the 2D material layer is high, the dopants at and/or near the upper surface of the first doping layer 220 may influence the charge carriers in the 2D channel layer 240, and may thus influence a region of the 2D channel layer 240 above the first doping layer 220. Additionally elements at the interface of the 2D channel layer 240 and the first doping layer 220 may undergo substitutional doping through migration and/or substitutions. Thus, the doping concentration in the region of the 2D channel layer 240 under the first electrode 270 may be increased greater than the doping concentration in the region of the 2D channel layer 240 between the third electrode 290 and the protruding portion 210A of the substrate 210 due to the first doping layer 220. The first doping layer 220 may be a layer doped at a concentration sufficient to achieve this result.

The second doping layer 230 is a layer for increasing the doping concentration in a region of the 2D channel layer 240 under the second electrode 280. The second doping layer 230 may apply the same principles as the first doping layer 220. For example, the doping concentration in the region of the 2D channel layer 240 under the second electrode 280 may be increased greater than the doping concentration in the region of the 2D channel layer 240 between the third electrode 290 and the protruding portion 210A of the substrate 210 due to the second doping layer 230. The second doping layer 230 may be a layer doped at a concentration sufficient to achieve this result. The first doping layer 220 may be a layer doped with a P-type dopant or an N-type dopant. The second doping layer 230 may be a layer doped with a P-type dopant or an N-type dopant. The first doping layer 220 and the second doping layer 230 may have the same or different types of doping. The doping materials described with reference to FIG. 1 may be used as doping materials in the first and second doping layers 220 and 230. By selecting types of dopant materials of the 2D channel layer 240, the first doping layer 220, and the second doping layer 230, the transistor 200 of FIG. 2 may also become transistors having various dopant types described in the <Example Embodiment 1> to <Example Embodiment 8>.

Figure 3:
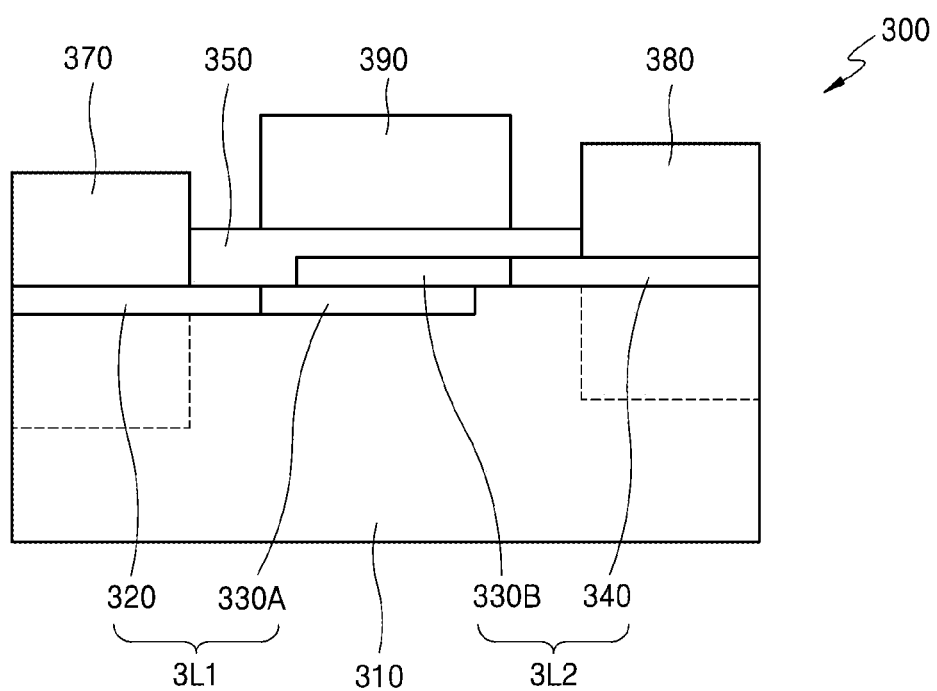
FIGS. 3 to 6 are cross-sectional views of transistors including 2D channels according to embodiments.

FIG. 3 shows a transistor 300 including 2D channel layers according to some example embodiments.

Referring to FIG. 3, the transistor 300 includes a substrate 310 and first and second 2D channel layers 3L1 and 3L2, first to third electrodes 370, 380, and 390, and an insulating layer 350 that are on the substrate 310. The substrate 310 may include, for example, the same material as the substrate 110 of FIG. 1, but may include different materials. The first 2D channel layer 3L1 includes first and second regions 320 and 330A. The second 2D channel layer 3L2 includes third and fourth regions 330B and 340. The role, material, doping concentration, doping type, and arrangement relationship of the first region 320 may follow those of the first region 120 of FIG. 1. The role, material, doping concentration, doping type, and arrangement relationship of the fourth region 340 may follow those of the third region 140 of FIG. 1. The second and third regions 330A and 330B have a vertically stacked portion and are in contact with each other. That is, a portion of the second and third regions 330A and 330B overlap each other in a vertical direction, and a portion of the third region 330B is directly over a portion of the second region 330A. Doping concentrations of the second and third regions 330A and 330B are less than that of the first and fourth regions 320 and 340. In some example embodiments, the doping concentrations of the second and third regions 330A and 330B may be equal to each other, and/or within the error ranges caused by manufacturing tolerances during the doping process. Accordingly, if a doping concentration difference appears between the second region 330A and the third region 330B, the difference may be small enough to be negligible. Accordingly, the doping concentrations of the second and third regions 330A and 330B may be substantially the same. Since the first and second 2D channel layers 3L1 and 3L2 are vertically stacked through the second and third regions 330A and 330B, when the transistor 300 is in an on state, a current flowing in the first and second 2D channel layers 3L1 and 3L2 may flow through a boundary between the second and third regions 330A and 330B by a tunneling action. Accordingly, the transistor 300 may be referred to as a tunneling transistor. For example, the flow of charge carriers across the boundary between the first and second 2D channel layers 3L1 and 3L2 may be modulated through quantum tunneling, instead of the thermionic modulation of a general (e.g. 3D or bulk) field effect transistor (FET). In the general field effect transistor, current flowing through a channel is determined by the flow of electrons having energy greater than the barrier of the channel. In addition, because the energy distribution of electrons follows the Fermi-Dirac distribution, the theoretical limit of a subthreshold swing value which indicates the switching speed of a transistor is given as ln(10)kT/q. Here, k refers to the Boltzmann constant, T refers to absolute temperature, and q refers to the magnitude of the electrical charge on the electron. Therefore, the subthreshold swing value of a general field effect transistor may not decrease to 60 mV/dec or less at room temperature. As the tunneling transistor is not limited by the Maxwell-Boltzman thermal mobility of charge carriers, as in the case of the general FET, the subthreshold swing (SS) of the tunneling transistor may be, for example, 60 mV/dec or less at room temperature.

The doped type of the second and third regions 330A and 330B may be a P/N type or an N/P type. Since the doped type of the first region 320 is N+ or P+ and the doped type of the fourth region 380 is N+ or P+, the transistor 300 may be a tunneling transistor having various doped types according to a combination of doped types of each region.

In FIG. 3, at least one of the first and second electrodes 370 and 380 may be located below the first and fourth regions 320 and 340 as indicated by the dotted boxes.

The first and second 2D channel layers 3L1 and 3L2 may be different 2D material layers from each other and/or may include different 2D material layers from each other. The first and second 2D channel layers 3L1 and 3L2 may be the same material as the 2D channel layer 1L1 of FIG. 1. For example, the first 2D channel layer 3L1 may be a layer formed of one material (hereinafter, referred to as a first 2D material) selected from among 2D materials used as the 2D channel layer 1L1 of FIG. 1, and the second 2D channel layer 3L2 may be a layer formed of another material (hereinafter, referred to as a second 2D material) selected from among 2D materials used as the 2D channel layer 1L1 of FIG. 1.

The role, material, and arrangement relationship of the first electrode 370, the second electrode 380, and the third electrode 390 may follow those of the first electrode 170, the second electrode 180, and the third electrode 190 of FIG. 1. The role, the material, and the arrangement relationship with adjacent members of the insulating layer 350 may follow those of the insulating layer 150 of FIG. 1. The insulating layer 350 may be formed on the first 2D channel layer 3L1 and extends onto the second 2D channel layer 3L2. The insulating layer 350 may cover an entire upper surface of the first 2D channel layer 3L1 exposed between the first electrode 370 and the second 2D channel layer 3L2. Also, the insulating layer 350 may cover an upper surface and a left side of a portion of the second 2D channel layer 3L2 between the first and second electrodes 370 and 380.

Figure 4:
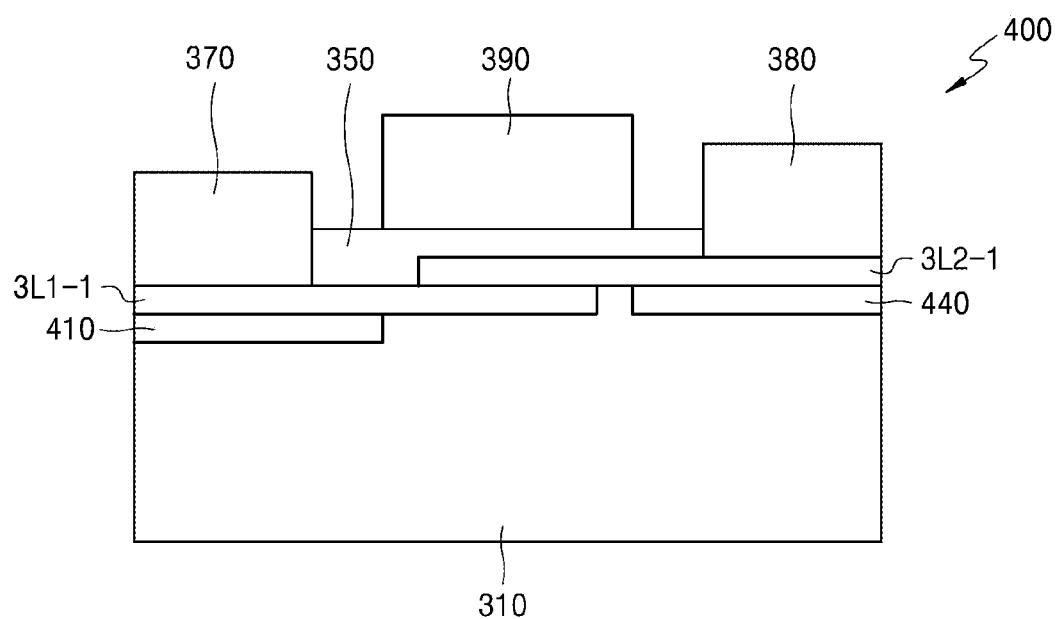

FIG. 4 shows a transistor 400 including 2D channel layers according to some example embodiments. The transistor 400 of FIG. 4 is formed by adding first and second doping layers 410 and 440 to the transistor 300 of FIG. 3. Accordingly, the transistor 400 will be described only for parts different from the transistor 300 of FIG. 3.

Referring to FIG. 4, specific regions of the first and second 2D channel layers 3L1-1 and 3L2-1 in the transistor 400, for example, regions corresponding to the second and third regions 330A and 330B of FIG. 3 may have a doping concentration at a level corresponding to the doping concentration of the second region 130 of FIG. 1. The transistor 400 includes the first doping layer 410 disposed under the first 2D channel layer 3L1-1 and the second doping layer 440 disposed under the second 2D channel layer 3L2-1. The material, doped type, and doping concentration of the first doping layer 410 may follow the first doping layer 220 of FIG. 2. The material, doped type, and doping concentration of the second doping layer 440 may follow the second doping layer 230 of FIG. 2. As in the transistor 300 of FIG. 3, the transistor 400 may be a tunneling transistor. Therefore, the activation voltage applied to the transistor 400 may be sufficiently low to activate the transistor by inducing quantum tunneling between the first 2D channel layer 3L1-1 and the second 2D channel layer 3L2-1 while minimizing and/or not inducing the Maxwell-Boltzman thermal mobility of charge carriers in the bulk substrate.

Figure 5:
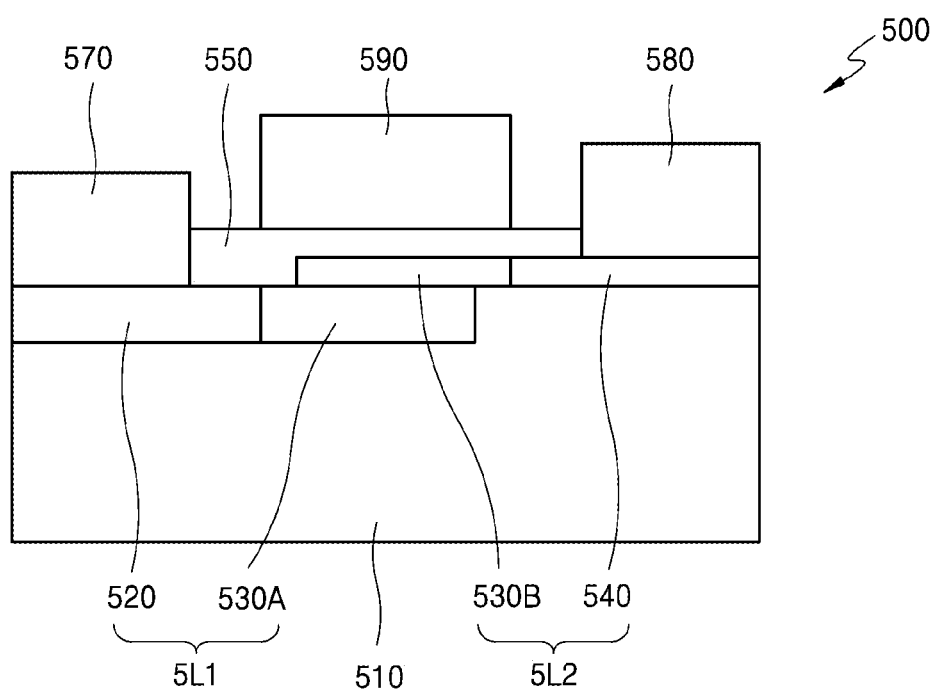

FIG. 5 shows a transistor 500 including 2D channels according to some example embodiments.

Referring to FIG. 5, the transistor 500 includes a substrate 510 and first and second channel layers 5L1 and 5L2, first to third electrodes 570, 580, and 590, and an insulating layer 550 on the substrate 510. The substrate 510 may include, for example, the same material as the substrate 110 of FIG. 1, but may include different materials. For example, the substrate may be a bulk (e.g., 3D) semiconductor material like Si and/or Ge. The first channel layer 5L1 is a 3D channel layer and may include first and second regions 520 and 530A. For example, the first channel layer 5L1 may include a semiconductor layer that may be used as a channel. The second channel layer 5L2 is a 2D channel layer and includes third and fourth regions 530B and 540. The first channel layer 5L1 may be a layer including a 3D material. For example, the first channel layer 5L1 may include a material for forming a channel layer of a conventional semiconductor field effect transistor (FET) that does not include a 2D channel.

The first channel layer 5L1 may have a thickness greater than that of the second channel layer 5L2. In one example, the first region 520 may be a region doped with a P-type or N-type conductive dopant. In another example, the first region 520 may be an undoped region. The role, material, doping concentration, doped type, and arrangement relationship of the fourth region 540 may follow the third region 140 of FIG. 1. The second region 530A may be a region doped with a P-type or N-type conductive dopant. Though, the second region 530A may comprise the same material as first region 520, the stacking type and arrangement relationship of a vertically stacked portion of the second and third regions 530A and 530B may follow the second and third regions 330A and 330B of the transistor 300 of FIG. 3. The doping concentration of the third region 530B may be less than that of the fourth region 540. Since the first and second channel layers 5L1 and 5L2 are vertically stacked through the second and third regions 530A and 530B, the transistor 500 may be a tunneling transistor as the transistor 300 of FIG. 3. The role, material, and arrangement relationship of the insulating layer 550 may follow those of the insulating layer 350 of FIG. 3. Materials, roles, and arrangement relationships of the first to third electrodes 570, 580, and 590 may follow those of the first to third electrodes 370, 380, and 390 of FIG. 3.

Figure 6:
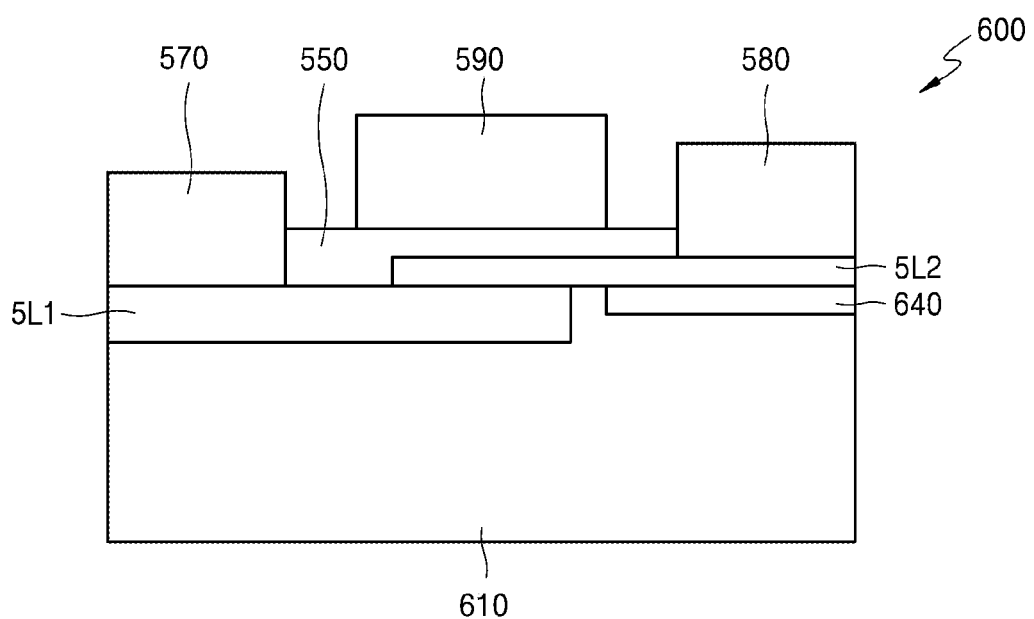

FIG. 6 shows a transistor 600 including 2D channels according to some example embodiments.

The transistor 600 of FIG. 6 is formed by adding a doping layer 640 to the transistor 500 of FIG. 5. Accordingly, the transistor 600 will be described only for parts different from the transistor 500 of FIG. 5.

Referring to FIG. 6, a specific region of the second channel layer 5L2 in the transistor 600, for example, a region corresponding to the third region 530B of FIG. 5 may have a doping concentration level corresponding to the doping concentration of the second region 130 of FIG. 1. The transistor 600 includes the doping layer 640 disposed under the second channel layer 5L2. The material, doped type, and doping concentration of the doping layer 640 may follow the second doping layer 220 of FIG. 2.

Figure 7:
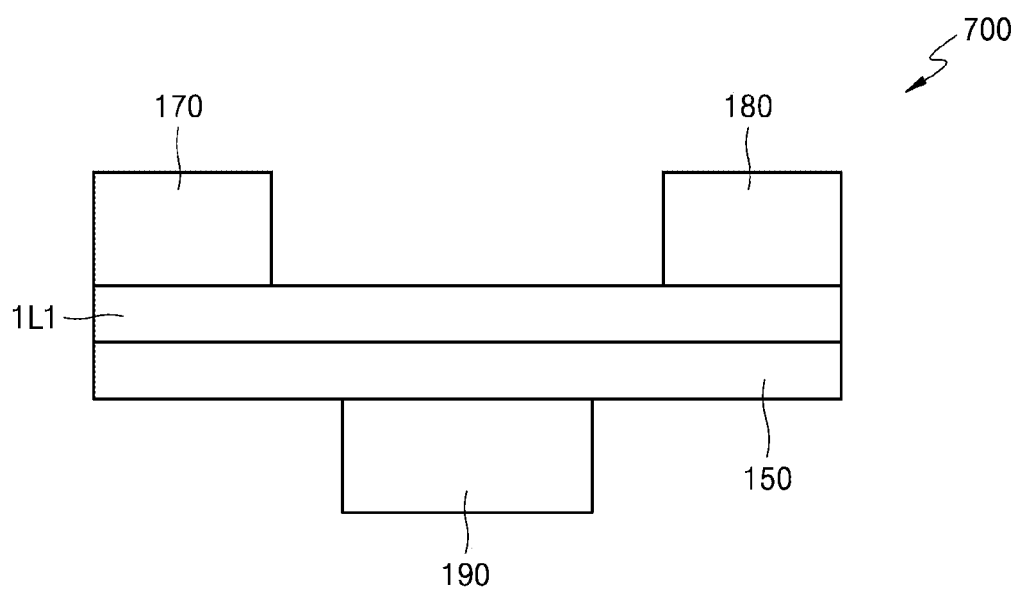
FIGS. 7 to 9 are cross-sectional views respectively illustrating examples when the transistors of FIGS. 1 to 3 are bottom gate transistors.

FIG. 7 shows a transistor 700 including a 2D channel according to some example embodiments.

In the transistor 700, the third electrode 190, used as a gate electrode in the transistor 100 of FIG. 1, is under the 2D channel layer 1L1. In FIG. 7, the third electrode 190 is located at the lowest position, and an insulating layer 150 is disposed between the third electrode 190 and the 2D channel layer 1L1. Accordingly, the third electrode 190 is not in direct contact with the 2D channel layer 1L1.

The transistor 100 of FIG. 1 may be referred to as a top gate transistor, while the transistor 700 may be referred to as a bottom gate transistor.

Figure 8:
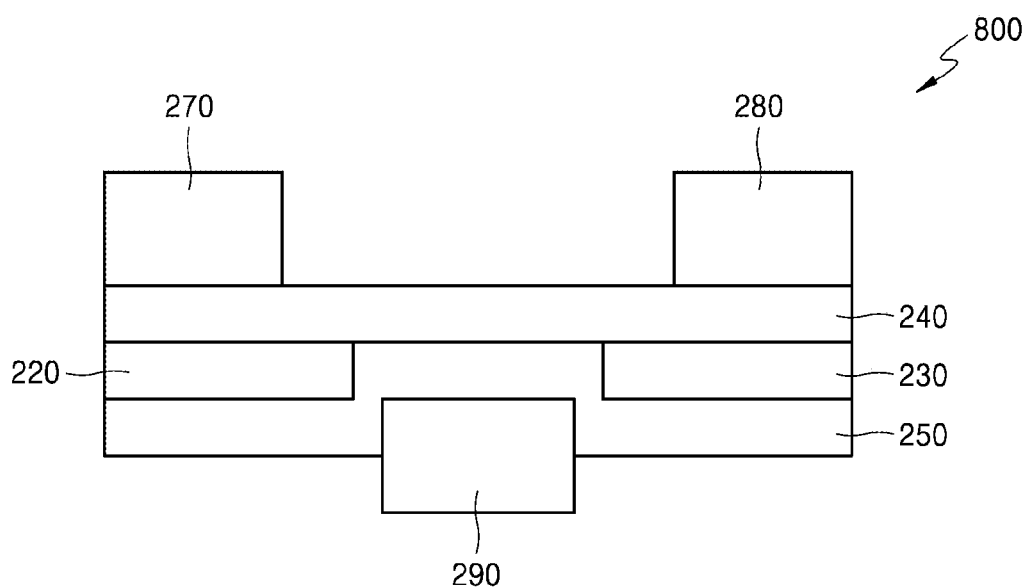

FIG. 8 shows a transistor 800 including a 2D channel according to some example embodiments.

Referring to FIG. 8, the transistor 800 is a bottom gate transistor in which the third electrode 290 used as a gate electrode in the transistor 200 of FIG. 2 is disposed under the 2D channel layer 240. The insulating layer 250 may be between the third electrode 290 and the 2D channel layer 240. The first doping layer 220 is located below the first electrode 270 and is disposed between the insulating layer 250 and the 2D channel layer 240. The first doping layer 220 is located on an upper surface of the insulating layer 250 on the left side of the third electrode 290. Accordingly, on the left side of the third electrode 290, a layer structure in which the insulating layer 250, the first doping layer 220, and the 2D channel layer 240 are sequentially stacked is formed. The second doping layer 230 is located below the second electrode 280 and is between the insulating layer 250 and the 2D channel layer 240. The second doping layer 230 is located on the upper surface of the insulating layer 250 on the right side of the third electrode 290. Accordingly, on the right side of the third electrode 290, layer structure in which the insulating layer 250, the second doping layer 230, and the 2D channel layer 240 are sequentially stacked is formed.

Figure 9:
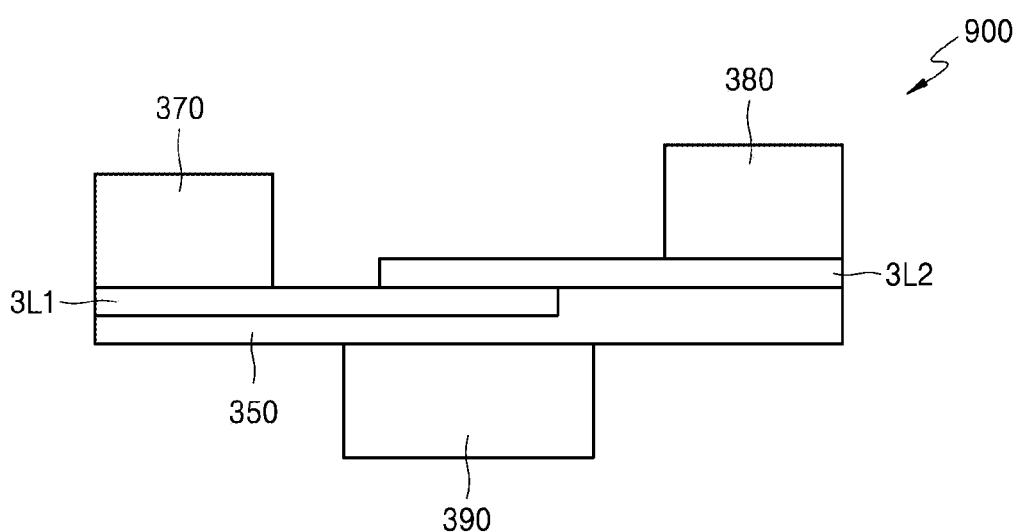

FIG. 9 shows a transistor 900 including a 2D channel according to some example embodiments.

Referring to FIG. 9, the transistor 900 is a bottom gate transistor in which a third electrode 390 used as a gate electrode in the transistor 300 of FIG. 3 is disposed under the 2D channel layer 3L1+3L2. The insulating layer 350 is located under the 2D channel layer 3L1+3L2 and between the third electrode 390 and the 2D channel layer 3L1+3L2.

Similarly, bottom gate transistors of the transistors 400, 500, and 600 of FIGS. 4 to 6 may also be inferred through the bottom gate transistors 700, 800, and 900 shown in FIGS. 7 to 9.

The aforementioned transistors including the 2D channel according to some example embodiments may be applied to various electronic devices including a switch and/or an amplifier, for example as part of processing circuity and/or memory.

Figure 11:
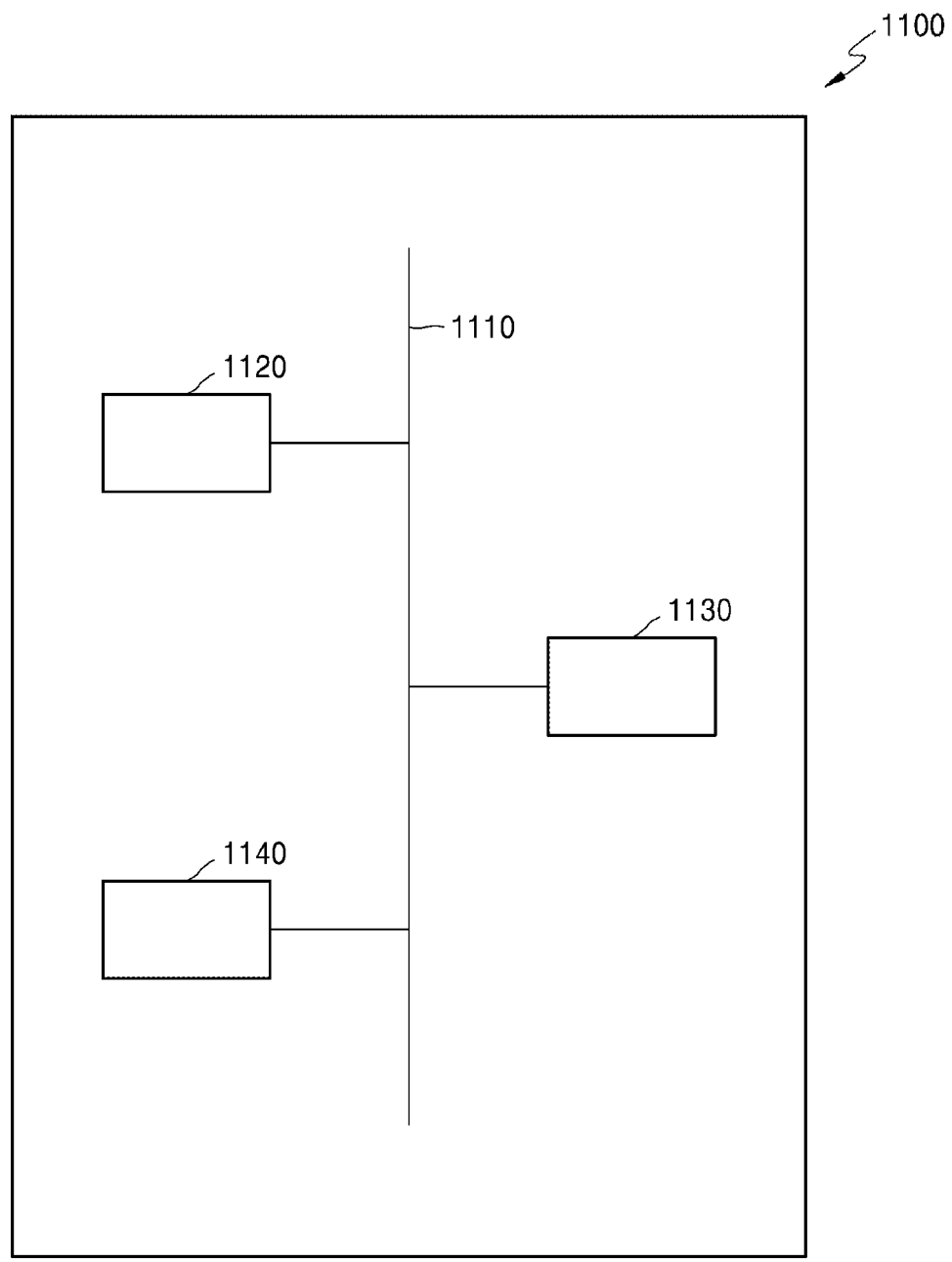
FIG. 11 shows a schematic of an electronic device that may include the aforementioned transistor including the 2D channel according to some example embodiments.

FIG. 11 shows a schematic of an electronic device that may include the aforementioned transistor including the 2D channel according to some example embodiments.

As shown, the electronic device 1100 includes one or more electronic device components, including a processor (e.g., processing circuitry) 1120 and a memory 1130 that are communicatively coupled together via a bus 1110.

The processing circuitry 1120, may be included in, may include, and/or may be implemented by one or more instances of processing circuitry such as hardware including logic circuits, a hardware/software combination such as a processor executing software; or a combination thereof. For example, the processing circuitry 1120 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1130 may include a non-transitory computer readable storage device, for example a solid state drive (SSD), storing a program of instructions, and the processing circuitry 1120 may be configured to execute the program of instructions to implement the functionality of the electronic device 1100.

In some example embodiments, the electronic device 1100 may include one or more additional components 1140, coupled to bus 1110, which may include, for example, a power supply, a light sensor, a light-emitting device, any combination thereof, or the like. In some example embodiments, one or more of the processing circuitry 1120, memory 1130, or one or more additional components 1140 may include any transistor including the 2D channel according to any of the example embodiments described herein, such that the one or more of the processing circuitry 1120, memory 1130, and/or one or more additional components 1140, and thus, the electronic device 1100, may have a transistor with a 2D channel with at least two regions having different doping concentrations, thereby providing a transistor with increased operation speeds and low power consumption; thus providing an electronic device having improved electrical characteristics and thus improved performance and/or reliability.

The transistor according to some example embodiments includes a 2D channel layer having a different doping concentration depending on a region, and a doping concentration of a region in contact with a source electrode or a drain electrode in the 2D channel layer is greater than that of other regions of the 2D channel layer. Therefore, a contact resistance between the source and drain electrodes and the 2D channel layer may be less than that of a 2D channel transistor of the related art. Accordingly, operation characteristics of the transistor according to some example embodiments may be improved, for example, the operation speed of the transistor may be increased, and power consumption may be reduced.

It should be understood that the example embodiments described herein should be considered in a descriptive sense only and not for purposes of limitation. Descriptions of features or aspects within each example embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A transistor comprising:
a first electrode;
a second electrode separated from the first electrode;
a gate electrode between the first and second electrodes; and
a channel layer including a two-dimensional (2D) channel, the channel layer contacting the first electrode and the second electrode,
wherein the 2D channel comprises at least two regions having different doping concentrations.

2. The transistor of claim 1, wherein the channel layer entirely comprises a 2D channel.

3. The transistor of claim 2, wherein the channel layer comprises a first region, a second region, and a third region having different doping concentrations compared to a neighboring region.

4. The transistor of claim 2, wherein the channel layer comprises a first region, a second region, and a third region, the doping concentrations of two regions of the first to third regions being the same, and the doping concentration of a remaining region of the first to third regions different from the doping concentration of the two regions.

5. The transistor of claim 4, wherein the first to third regions are doped with the same type of dopant.

6. The transistor of claim 5, wherein the first to third regions are doped with an N+ type dopant, an N type dopant, and an N+ type dopant, respectively.

7. The transistor of claim 5, wherein the first to third regions are doped with a P+ type dopant, a P type dopant, and a P+ type dopant, respectively.

8. The transistor of claim 4, wherein the two regions are doped with a first type of dopant, and the remaining region is doped with a second type of dopant different from the first type of dopant.

9. The transistor of claim 8, wherein the first type of dopant comprises an N+ type dopant or a P+ type dopant.

10. The transistor of claim 9, wherein the second type of dopant comprises an N type dopant or a P type dopant.

11. The transistor of claim 4, wherein the two regions are doped with different types of dopants, and the remaining region is doped with the same type of dopant as one of the two regions.

12. The transistor of claim 11, wherein one of the two regions comprises an N+ type region, and another of the two regions comprises a P+ type region.

13. The transistor of claim 12, wherein the remaining region is a P type or N type region.

14. The transistor of claim 2, wherein the channel layer comprises a first 2D channel and a second 2D channel.

15. The transistor of claim 14, wherein the transistor is a tunneling transistor.

16. The transistor of claim 14, wherein the first 2D channel and the second 2D channel include different materials.

17. The transistor of claim 16, wherein the material of the first 2D channel comprises at least one of a transition metal dichalcogenide (TMD) or black phosphorous (BP).

18. The transistor of claim 16, wherein the material of the second 2D channel comprises at least one of a transition metal dichalcogenide (TMD) or black phosphorous (BP).

19. The transistor of claim 14, wherein
the first 2D channel comprises two regions having different doping concentrations, and
the second 2D channel comprises two regions having different doping concentrations.

20. The transistor of claim 19, wherein, a region of the first 2D channel having a lower doping concentration than the remaining region of the first 2D channel and a region of the second 2D channel have a lower doping concentration than the remaining region of the second 2D channel directly overlap in a region corresponding to the gate electrode.

21. The transistor of claim 20, wherein dopant types of the overlapping regions of the first and second 2D channels are different from each other.

22. The transistor of claim 1, wherein the channel layer further includes a 3D channel.

23. The transistor of claim 22, wherein, in a region corresponding to the gate electrode, the 2D channel and a portion of the 3D channel overlap each other.

24. The transistor of claim 22, wherein
the 3D channel is in contact with the first electrode, and
the 2D channel is in contact with the second electrode.

25. The transistor of claim 24, wherein a doping layer is under the 2D channel in a region corresponding to the second electrode.

26. The transistor of claim 22, wherein the 2D channel comprises two regions with different doping concentrations.

27. The transistor of claim 22, wherein the 3D channel comprises two regions with different doping concentrations.

28. The transistor of claim 22, wherein the 2D channel comprises a least one of a transition metal dichalcogenide (TMD) or black phosphorous (BP).

29. The transistor of claim 1, wherein the 2D channel comprises at least of a transition metal dichalcogenide (TMD) or black phosphorous (BP).

30. The transistor of claim 29, wherein the 2D channel comprises the TMD and a dopant,
the dopant including at least one heterogeneous element other than the elements constituting the TMD.

31. The transistor of claim 1, wherein the transistor is a top gate transistor.

32. The transistor of claim 1, wherein the transistor is a bottom gate transistor.

33. An electronic device comprising:
The transistor of claim 1.

34. A transistor comprising:
a source electrode;
a drain electrode that is separated from the source electrode;
a gate electrode arranged between the source electrode and the drain electrode;
a two-dimensional (2D) channel layer contacting the source electrode and the drain electrode;
a first doping layer under and contacting the 2D channel layer in a region corresponding to the source electrode; and
a second doping layer under and contacting the 2D channel layer in a region corresponding to the drain electrode,
wherein each of the first doping layer and the second doping layer includes a P type dopant or an N type dopant.

35. The transistor of claim 34, wherein a portion of the 2D channel layer in a region corresponding to the gate electrode has a first doping concentration.

36. The transistor of claim 35, wherein portions of the 2D channel layer contacting the first and second doping layers have a second doping concentration greater than the first doping concentration.

37. The transistor of claim 36, wherein
the portion of the 2D channel layer corresponding to the gate electrode is doped with a first type of dopant, and
The portions of the 2D channel layer contacting the first and second doping layers are doped with a second type of dopant supplied from the first and second doping layers.

38. The transistor of claim 37, wherein the first type of dopant is an N type dopant or a P type dopant.

39. The transistor of claim 37, wherein the second type of dopant is the N type dopant or the P type dopant.

40. The transistor of claim 34, wherein the transistor is a top gate transistor.

41. The transistor of claim 34, wherein the transistor is a bottom gate transistor.

42. An electronic device comprising:
The transistor of claim 34.

* * * * *